(12) United States Patent
Ozeki et al.

(10) Patent No.: US 6,551,867 B1
(45) Date of Patent: Apr. 22, 2003

(54) NON-VOLATILE SEMICONDUCTOR MEMORY DEVICE AND METHOD FOR MANUFACTURING THE SAME

(75) Inventors: Kazuyuki Ozeki, Gunma (JP); Yukihiro Oya, Saitama (JP); Kazutoshi Kitazume, Gunma (JP); Hideo Azegami, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/488,917

(22) Filed: Jan. 19, 2000

(65) Prior Publication Data (65)

(30) Foreign Application Priority Data

| Jan. 25, 1999 | (JP) | 11-015949 |
| Jan. 25, 1999 | (JP) | 11-015950 |
| Feb. 2, 1999 | (JP) | 11-046737 |

(51) Int. Cl.$^7$ .................. H01L 21/00; H01L 21/84
(52) U.S. Cl. .................. 438/159; 438/165; 438/278; 438/637
(58) Field of Search .................. 438/99, 100, 128, 438/159, 165, 185, 201, 210, 211, 256, 257, 278, 289, 329, 366, 373, 391, 475, 483, 485, 552, 587, 593, 595, 637, 680, 770, 800, 951, 958, 975, 976

(56) References Cited

U.S. PATENT DOCUMENTS

| 5,067,108 | A | * | 11/1991 | Jenq | 365/185 |
| 5,215,933 | A | * | 6/1993 | Araki | 437/43 |
| 5,795,833 | A | * | 8/1998 | Yu et al. | 438/763 |
| 6,025,279 | A | * | 2/2000 | Chiang et al. | 438/760 |
| 6,028,013 | A | * | 2/2000 | Annapragada et al. | 438/783 |
| 6,118,145 | A | * | 9/2000 | Egawa | 257/296 |

* cited by examiner

Primary Examiner—Amir Zarabian
Assistant Examiner—Pamela Perkins
(74) Attorney, Agent, or Firm—Fish & Richardson P.C.

(57) ABSTRACT

A non-volatile semiconductor memory device includes an interlayer dielectric film 9, 19 flattened by etching back an SOG film. In the non-volatile semiconductor memory device, a barrier film of a silicon nitride film 9D and 19D is formed to cover at least a memory cell composed of a floating gate 4, a control gate 6, etc. Because of such a structure, even if H or OH contained in the SOG is diffused, it will not be trapped by a tunneling film 3. This improves a "trap-up rate". The barrier film may be formed in only an area covering the memory cell. This reduces its contact area with a tungsten silicide film, thereby suppressing film peeling-off. Thus, the operation life of the memory cell in the non-volatile semiconductor memory device can be improved.

13 Claims, 11 Drawing Sheets

NON-VOLATILE SEMICONDUCTOR MEMORY DEVICE AND METHOD FOR MANUFACTURING THE SAME

BACKGROUND OF THE INVENTION

1. Field of the Invention

The present invention relates to a non-volatile semiconductor memory device having a floating gate and a control gate which is formed to overlap the floating gate through a tunneling oxide film covering the floating gate, and a method of manufacturing it, and more particularly to technology for preventing a reduction in the erasure efficiency when data erasure is repeated by extracting charges (electrons) stored in the floating gate towards the control gate, thereby extending the operation life (cycle life) of a memory cell.

2. Description of the Related Art

In an electrically erasable non-volatile semiconductor memory device composed of memory cells each consisting of a single transistor, particularly a programmable ROM (EEPROM: Electrically Erasable and Programmable ROM, also referred to as "flash memory"), each memory cell consists of a transistor in a double-gate structure having a floating gate and a control gate. In such a memory cell transistor in a double gate structure, write of data is performed by accelerating hot electrons generated on the side of a drain region so as to be injected into the floating gate. Erasure of data is performed by extracting charges from the floating gate to the control gate through F-N tunneling (Fowler-Nordheim tunneling).

FIG. 10 is a plan view of a memory cell portion of a non-volatile semiconductor memory device having a floating gate. FIG. 11 is a sectional view taken in line X1—X1 in FIG. 10. The memory cell portion adopts a split gate structure in which a control gate is arranged in parallel to a floating gate.

A plurality of element isolation films 2 of a thick LOCOS oxide film selectively formed by LOCOS (Local Oxidation of Silicon are formed in stripes on a surface area of a P-type semiconductor substrate 1 so that element areas are sectioned from one another. Floating gates 4 are formed on the semiconductor substrate 1 so that each of them extends between adjacent element isolation films 2 through an oxide film 3A. The floating gate 4 is arranged individually in each memory cell. By selective oxidation, a selective oxide film 5 on the floating gate 4 is formed to be thicker in the central area and have an acute corner on the edge thereof so that concentration of an electric field is likely to occur at the edge of the floating gate 4 during data erasure.

On the semiconductor substrate 1 on which the plurality of floating gates 4 are arranged, control gates 6 are arranged so as to correspond to the respective columns of the floating gates 4 through the tunneling oxide film 3 integrated to the oxide films 3A. The control gate 6 partially overlaps the floating gate 4 and the remaining portion thereof abuts on the semiconductor substrate 1 through the oxide film 3A. The floating gates 4 and the control gates 6 are arranged so that they are symmetrical from each other in adjacent columns.

An N-type drain region 7 and a N-type source region 8 are formed in the substrate areas between the control gates 6 and between the floating gates 4. The drain region 7 is individually surrounded by the element isolation films 2 between the control gates 6, whereas the source region 8 extends along the control gate 6. These floating gate 4, control gate 6, drain region 7 and source region 8 constitute a memory cell transistor.

A metallic wiring 10 of aluminum alloy is arranged on the control gate 6 in a direction perpendicular to the control gate through an interlayer insulating film 9. The metallic wiring 10 is connected to the drain region 8 through a contact hole 11. Each control gate 6 serves as a word line whereas the source region 8 extending along the control gate 6 serves as a source line. The metallic wiring 10 connected to the drain region 7 serves as a bit line.

In the case of the memory cell transistor in a double gate structure, the "on" resistance between the source and drain varies according to the quantity of charges injected into the floating gate 4. Therefore, by selectively injecting the charges into the floating gate 4 so that the "on" resistance of a specific memory cell transistor is varied, a difference thus produced in the operation characteristic of each memory cell transistor is correlated with the data to be stored.

The respective operations of write, erasure and read of data in the non-volatile semiconductor memory device can be performed in the following manner. In the write of data(data writing operation), the potential of the control gate 6 is set at 2 V; the potential of the drain region 7 is set at 0.5 V and the high potential of the source region 8 is set at 12 V. In this case, the potential of the floating gate 4 is elevated to about 9 V because of the difference in the capacitive couplings between the control gate 6 and floating gate 4 and between the floating gate 4 and substrate (source region 8) (i.e. capacitance between the control gate 6 and floating gate 4<capacitance between the floating gate 4 and substrate). Thus, the hot electrons generated in the vicinity of the drain region are accelerated toward the floating gate 4 and injected into the floating gate 4 through the oxide film 3A, thereby making the write of data.

In the erasure of data(data-erasing operation), the potential of each of the drain region 7 and source region 8 is set at 0 V and that of the control gate 6 is set at 14 V. In this case, the charges (electrons) pass through the tunnelling oxide film 3 from the acute portion at the corner of the floating gate 4 by the F-N (Fowler-Nordheim tunneling) conduction so that they are discharged into the control gate 6, thereby making the erasure of data.

In the read of data(data-reading operation), the potential of the control gate 6 is set at 4 V; that of the drain region 7 is set at 2 V and that of the source region 8 is set at 0 V. In this case, if the charges (electrons) have been injected in the floating gate 4, the potential at the floating gate 4 becomes low. Therefore, no channel is formed beneath the floating gate 4 so that a drain current does not flow. In contrast, if the charges (electrons) have not been injected in the floating gate 4, the potential of the floating gate 4 becomes high. Therefore, the channel is formed beneath the floating gate 4 so that the drain current flows.

FIG. 9 is a graph showing a measurement result (indicated by one-dot chain line) of a cycle life (number of times of the erasure/write of data: E/W Cycle) in a conventional device having the above configuration. As seen from the graph, the accumulated failure rate (%) increases with an increase of the E/W cycle. Incidentally, the "failure" in this case refers to the operation life of a memory cell when the cell current lowers to a decidable level (e.g. when the memory cell current of the memory cell in the erasure state becomes 30 $\mu$m which is 30% of the initial value of 100 $\mu$m).

As seen from the graph, in the conventional non-volatile semiconductor memory device, when the number of times of E/W of data reaches about 70,000 times, the accumulated failure rate reaches 100%.

A general programmable memory requires the E/W cycle of about 100,000 times, and that of 70,000 times is insufficient. Therefore, it has been demanded to increase the number of times of the E/W cycle.

As a result of analysis by the inventors of the present invention, it has been found that the material of the interlayer dielectric film formed on the memory cell transistor is correlated with the cycle life.

Specifically, in an device configuration in which a relatively large level difference occurs because the control gate overlaps the floating gate like the non-volatile semiconductor memory device according to the present invention, an interlayer dielectric film 9 subjected to an etch back step of a SOG (Spin On Glass) film is formed.

The inventors have supposed that the cycle life is influenced by the fact that H or OH contained in the SOG film will be diffused and trapped by the tunneling oxide film.

The plasma hydrogen ($H_2$)when a plasma silicon nitride (SiN) film used as a final passivation film is deposited by the plasma LPCVD may influence the cycle life.

SUMMARY OF THE INVENTION

An object of the present invention is to provide a non-volatile semiconductor memory device capable of improving the operation life of a memory cell, and its manufacturing method.

Another object of the present invention is to provide a high quality non-volatile semiconductor memory device free from film peeling-off and its manufacturing method.

The non-volatile semiconductor memory device according to the first aspect of the present invention is characterized by comprising: a floating gate formed on a semiconductor substrate having a first conduction type; a tunneling dielectric film covering the floating gate; a control gate formed to have a region overlapping the floating gate through the tunneling dielectric film; diffused regions formed on a surface of the semiconductor substrate adjacent to the floating gate and the control gate, the diffused region having a second conduction type opposite to the first conduction type; a silicon nitride film which covers at least a portion of an area where a memory cell region is to be formed; and a wiring connected to the diffused region through an interlayer dielectric film formed on the silicon nitride film.

In one embodiment in accordance with our invention, the interlayer dielectric film is a dielectric film containing at least an SOG film.

In another embodiment in accordance with our invention, the silicon nitride film is formed to cover an entire surface of the semiconductor substrate.

In another embodiment in accordance with our invention, the silicon nitride film is formed to cover an entire surface of the semiconductor substrate exclusive of an outer periphery thereof.

In another embodiment in accordance with our invention, the silicon nitride film is selectively formed on a prescribed region of an area where the memory cell is to be formed.

In another embodiment in accordance with our invention, the silicon nitride film is formed to cover the floating gate and control gate on the side of one diffused region.

In another embodiment in accordance with our invention, the silicon nitride film is formed to cover at least an end portion of the control gate which is located on the floating gate.

In another embodiment in accordance with our invention, the silicon nitride film is formed in a belt shape so as to cover at least an area extending from a source region to the end of the control gate which is located on the floating gate.

In another embodiment in accordance with our invention, the silicon nitride film is selectively formed so as to cover the region exclusive of an area where a drain contact is to be formed and periphery thereof.

The method for manufacturing a non-volatile semiconductor memory device according to the second aspect of the present invention is characterized by comprising the steps of: forming a gate dielectric film on a Si substrate having a first conduction type; forming floating gates on the gate dielectric film; forming a tunneling dielectric film so as to cover the floating gates; forming control gates on the tunneling dielectric film so as to have a region overlapping the floating gates through the tunneling dielectric film; forming a first diffused region on a surface of the semiconductor substrate so as to be located between the adjacent floating gates, the diffused region having a second conduction type opposite to the first conduction type; successively stacking forming a dielectric film and a silicon nitride film on the entire surface of the Si substrate; patterning the silicon nitride film so as to cover the floating gate and control gate on the side of the first diffused region and to expose a second diffused region; anisotropically etching the dielectric film so as to cover the floating gate and control gate on the side of the first diffused region and to expose the substrate surface on the side of an area where the second diffused region is to be formed and patterning the dielectric film to form a side wall spacer film covering the side wall of the control gate on the side of the area where the second diffused region is to be formed; forming the second diffused region having the second conduction type on the surface of the Si substrate; forming a flattened interlayer dielectric layer inclusive of a step of etching back an SOG film formed on the entire surface of the substrate; and making a wiring in contact with the second diffused region through an hole made in the interlayer dielectric layer.

The above and other objects and features of the present invention will be more apparent from the following description taken in conjunction with the accompanying drawings.

DESCRIPTION OF THE PREFERRED EMBODIMENTS

Figure 10:
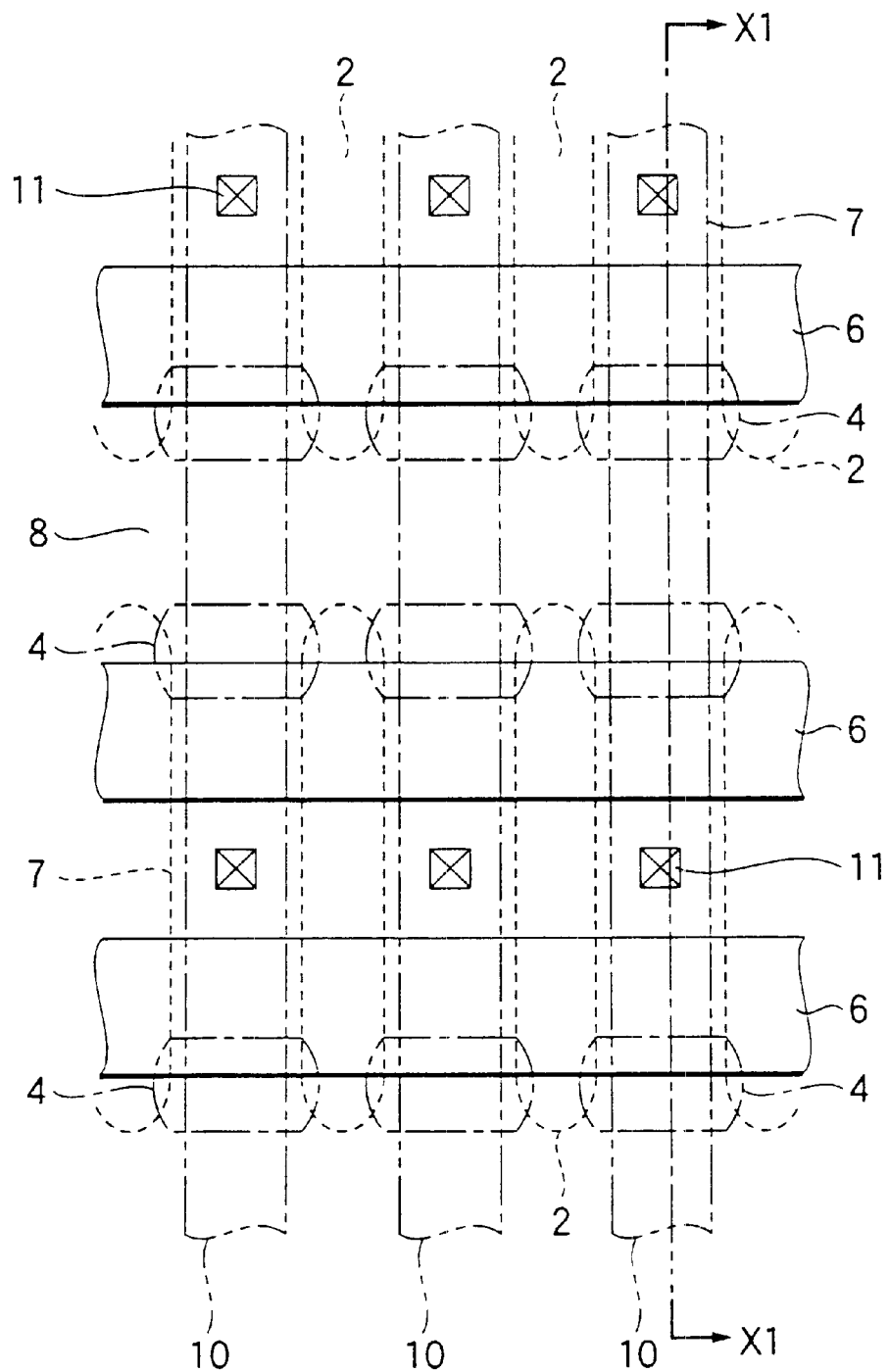
FIG. 10 is a plan view of the memory structure of a conventional non-volatile semiconductor memory device.

Now referring to the drawings, an explanation will be given of an embodiment of a non-volatile semiconductor memory device and its manufacturing method according to the present invention. The plan view of the non-volatile semiconductor memory device having a floating gate are substantially the same as FIG. 10 used for explaining the prior art. In the following description, like reference numeral refer to like elements in FIG. 10. The feature of the present invention resides in the structure of an interlayer dielectric film 9 covering a memory cell composed of a floating gate 4, a control gate 6, etc. as shown in FIG. 4B. (FIGS. 1A–4A show a process for forming the memory cell as shown in FIG. 4B.) Although explained later in detail, the feature resides in that in a device including an the interlayer dielectric film 9 flattened in an etch back step of an SOG film, a barrier film for preventing H, OH, etc. from being diffused in a memory cell is formed.

Specifically, since the barrier film is formed at a level lower than that where at least the SOG film is deposited, the deterioration of the memory cell characteristic due to the diffusion of O, OH, etc, from the SOG film can be suppressed. In this embodiment, a silicon nitride film 9D made by LPCVD is used as the barrier metal. The silicon nitride film is relatively dense in its film quality and is effectively used as the barrier film.

Further, the characteristic of the memory cell may be deteriorated owing to the fact that the plasma hydrogen ($H_2$) and others generated when the plasma silicon nitride film used for a final passivation film are diffused and trapped by the tunneling oxide film 3 so that the "trap-up rate" is reduced. The plasma silicon nitride film is inferior to that made by LPCVD in their film quality. Therefore, it is likely to produce cracks to provide poor waterproofing. However, since the plasma silicon nitride film can be deposited in a very short time, the plasma CVD has been widely used to deposit a thick film such as a passivation film. Thus, in the structure in which the plasma silicon nitride film is used, the provision of the barrier film of the silicon nitride film 9D suppresses reduction in the trap-up rate.

Now referring the drawings simplified for convenience of illustration, an explanation will be given of a method of manufacturing a memory cell in such a non-volatile semiconductor memory device.

Figure 1A:
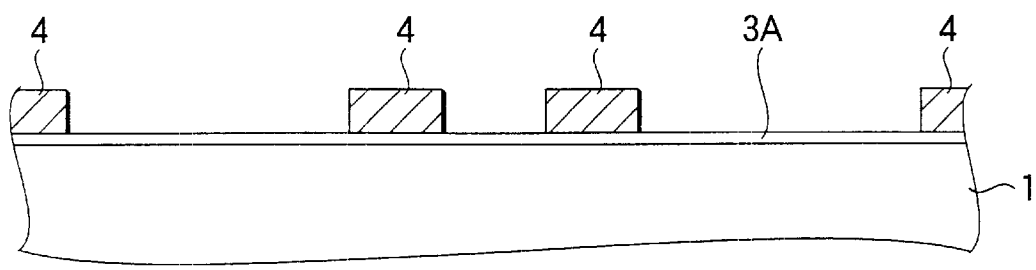
FIGS. 1 to 5 are sectional views for explaining the method of manufacturing a non-volatile semiconductor memory device according to an embodiment of the present invention.

First, as seen from FIG. 1A, an element isolation film is formed in a predetermined region of a semiconductor substrate 1 (FIG. 10), and a gate oxide film 3A having a thickness of 100 A is formed on the surface layer exclusive of the element isolation film 2. A polycrystalline silicon film having a thickness of 1500 A is formed on the gate oxide film 3A, and doped with phosphorus so as to be made conductive. Thereafter, by the known photolithography, the polycrystalline silicon film is patterned to form floating gates 4.

Figure 1B:
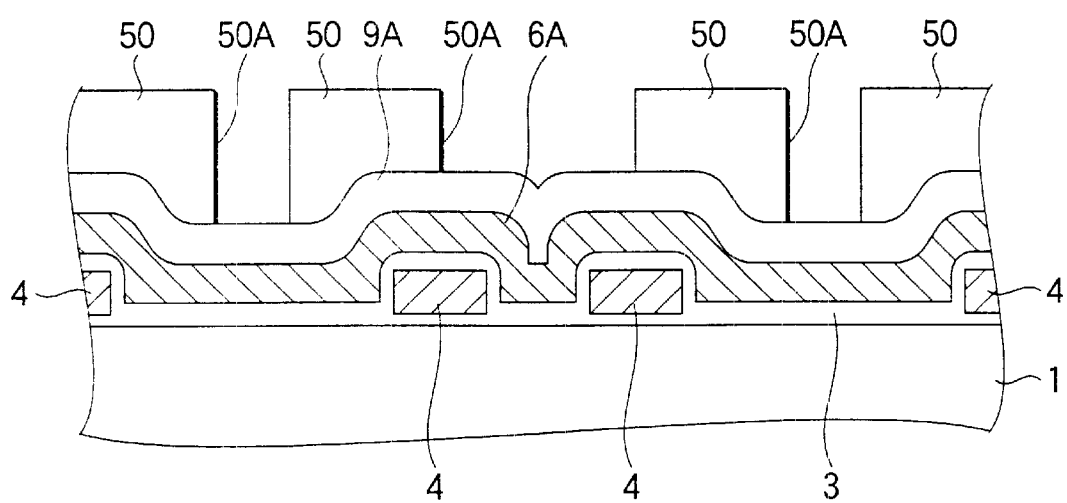

As shown in FIG. 1B, a dielectric film 3 (hereinafter referred to as "tunneling oxide film") having a thickness of about 300 A is formed integrally to the gate oxide film 3A so as to cover the floating gates 4. Incidentally, the above tunneling oxide film 3 is formed by thermal oxidation after a CVD oxide film, e.g. TEOS (Tetra Ethyl Ortho Silicate) film and HTO (High Temperature Oxide) film, etc. has been formed by LPCVD.

A conductive film 6A having a double-layer structure composed of a polycrystalline silicon film and tungsten silicide film (WSix film) is formed on the entire surface of the substrate 1. The conductive film 6A can be formed in such a manner that a polycrystalline silicon film having about 1000 A is formed, and doped with phosphorus using $POCl_3$ as a diffusion source, and a tungsten silicide film (WSix film) having a thickness of 1200 A is formed on the polycrystalline silicon film. Further, a dielectric film 9A having a thickness of about 2500 A is formed on the conductive film 9A. Thereafter, a photoresist film 50 is formed on the dielectric film 9A, and openings 50A are formed at positions corresponding to the areas where a source and a drain region are to be formed in the photoresist film 50.

Figure 2A:
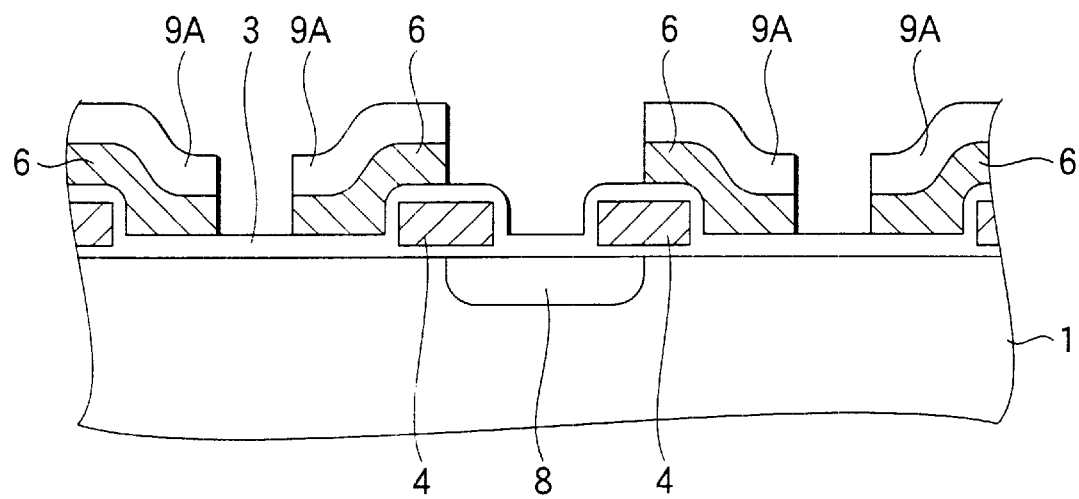
Figure 3A:
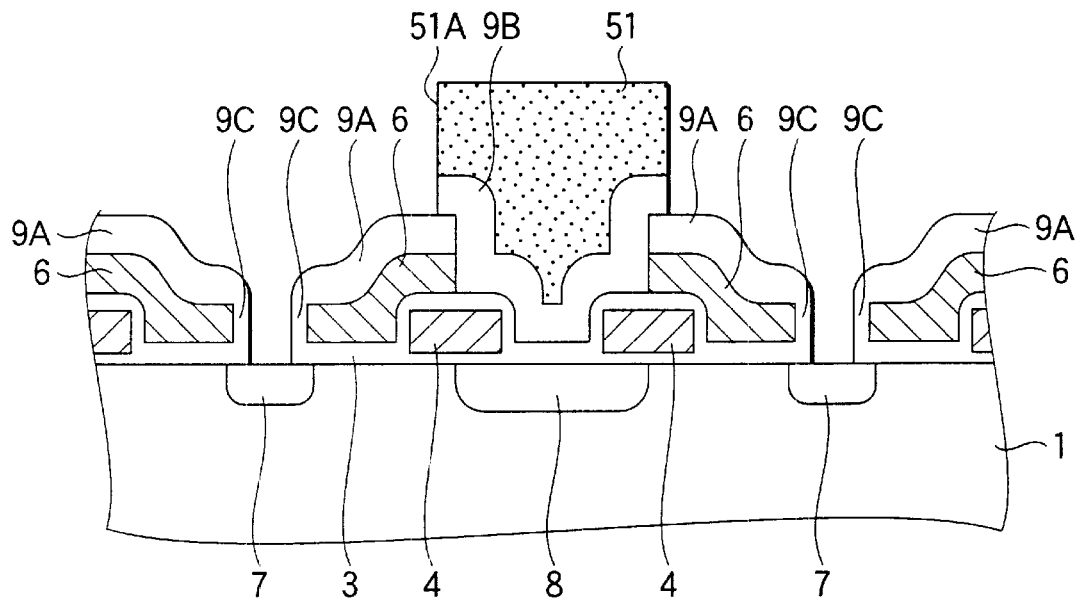

By etching the dielectric film 9A and conductive film 6A using the resist film 50 as a mask, as shown in FIG. 2A, each of control gates 6 with the dielectric film 9A stacked thereon is formed to extend from the upper wall of the floating gate 4 to the side wall thereof through the tunneling oxide film 3. After the resist film 50 has been removed, at least the area where the drain region is to be formed is covered with a photoresist film (not shown). Using the photoresist film as a mask, the surface layer of the substrate 1 between the adjacent floating gates 4 is doped or implanted with N-type impurities, e.g. phosphorus ions under the condition of dosage of $5.0 \times 10^{15}/cm^2$ and an acceleration voltage of 60 KeV, and diffused by annealing to form a source region 8. The N-type impurities to be implanted may be arsenic (As) ions.

Figure 2B:
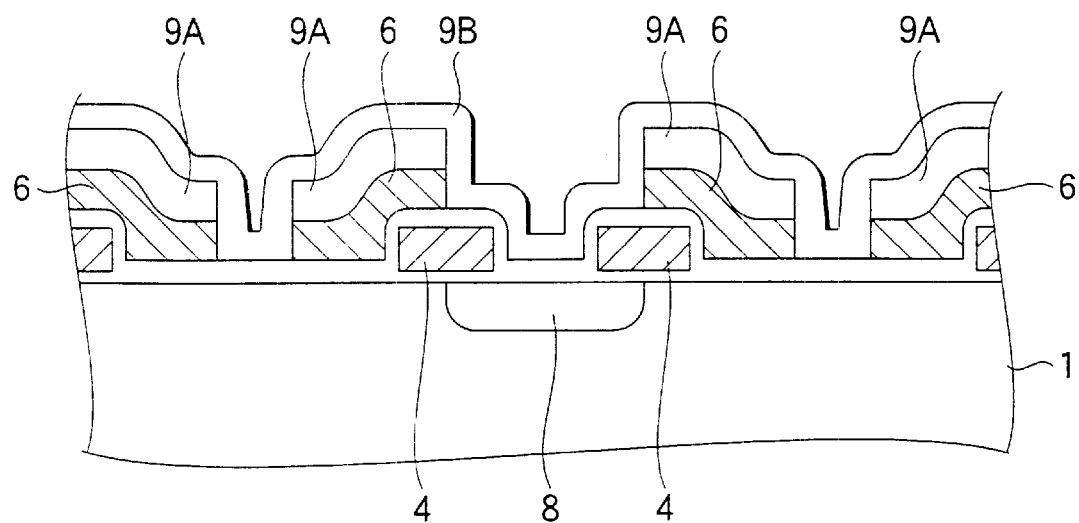

As shown in FIG. 2B, by LPCVD, a dielectric film 9B made of an oxide film having a thickness of about 2000 A is formed on the entire surface of the substrate 1. Thereafter, as shown in FIG. 3A, using a photoresist film 51 having an opening 51a covering the source region 8 as a mask, the dielectric film 9B and dielectric film 3 (tunneling film 3) are anisotropically etched to expose an area where a drain region is to be formed and form a side wall spacer 9C. Using the photoresist film 51 as a mask, the surface layer of the substrate 1 between the adjacent floating gates 4 is doped or implanted with N-type impurities, e.g. phosphorus ions under the condition of dosage of $1.0 \times 10^{13}/cm^2$ and an acceleration voltage of 40 KeV, and diffused by annealing to form a drain region 7. The N-type impurities to be implanted may be arsenic (As) ions.

Figure 3B:
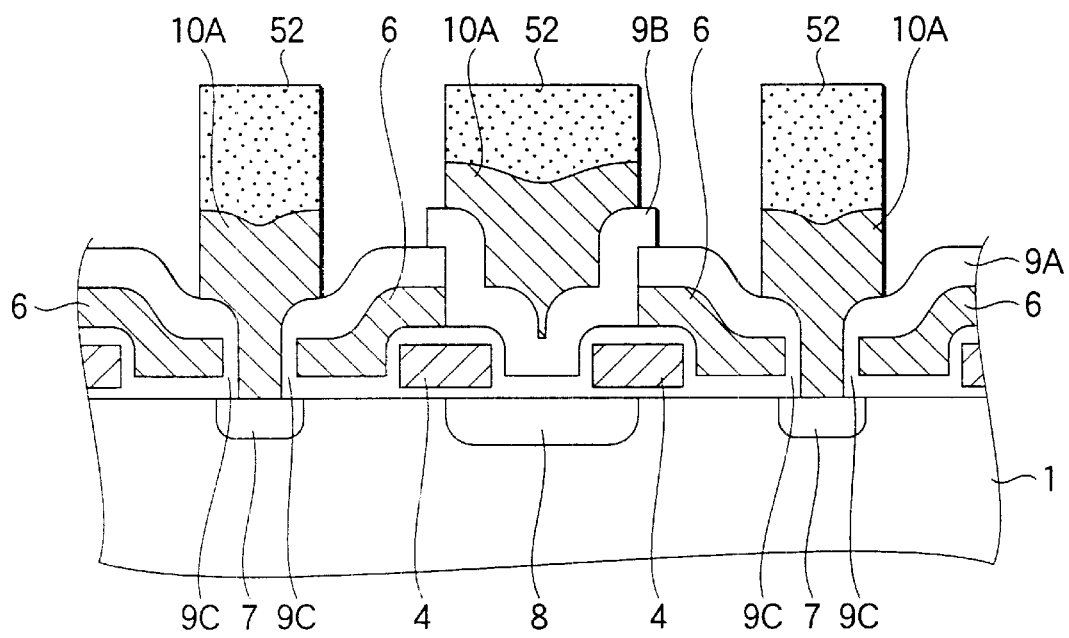

As shown in FIG. 3B, a laminate film, which is composed of a conductive polycrystalline silicon film having a thickness of 1000 A which is in contact with the source and drain regions and a tungsten silicide film (WSix film) having a thickness of 1200 A, is formed. Using a photoresist film 52 as a mask, the laminate film is patterned to form an electrode wiring film 10A. In this case, the electrode wiring film 10A in contact with the drain region 7 is formed in a self-aligned manner through the side wall spacer 9C.

Figure 4A:
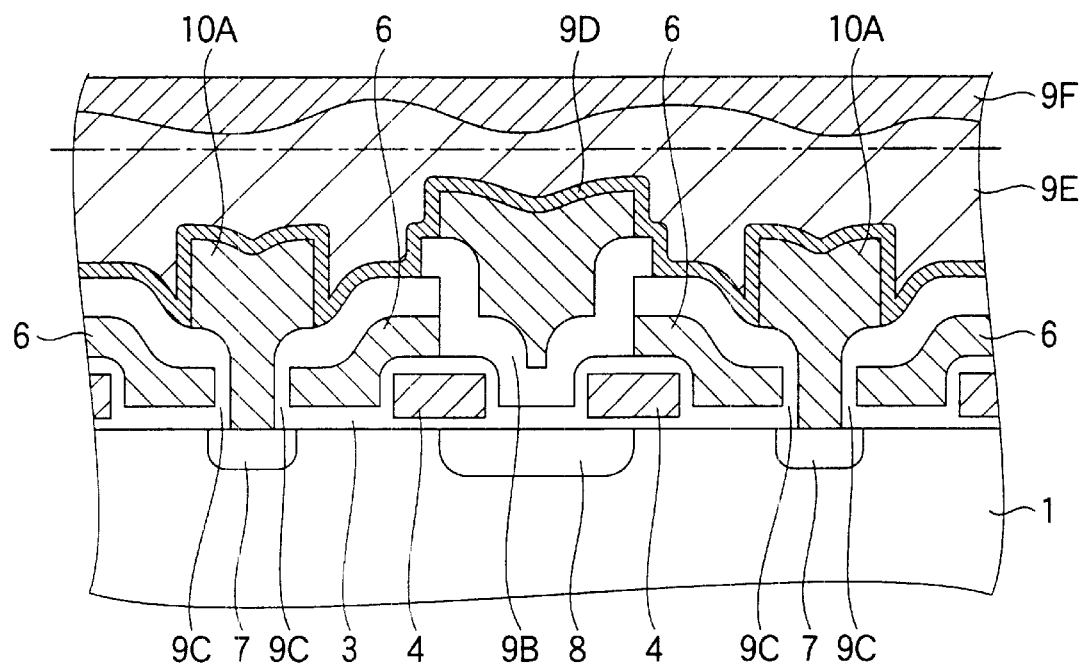
Figure 4B:
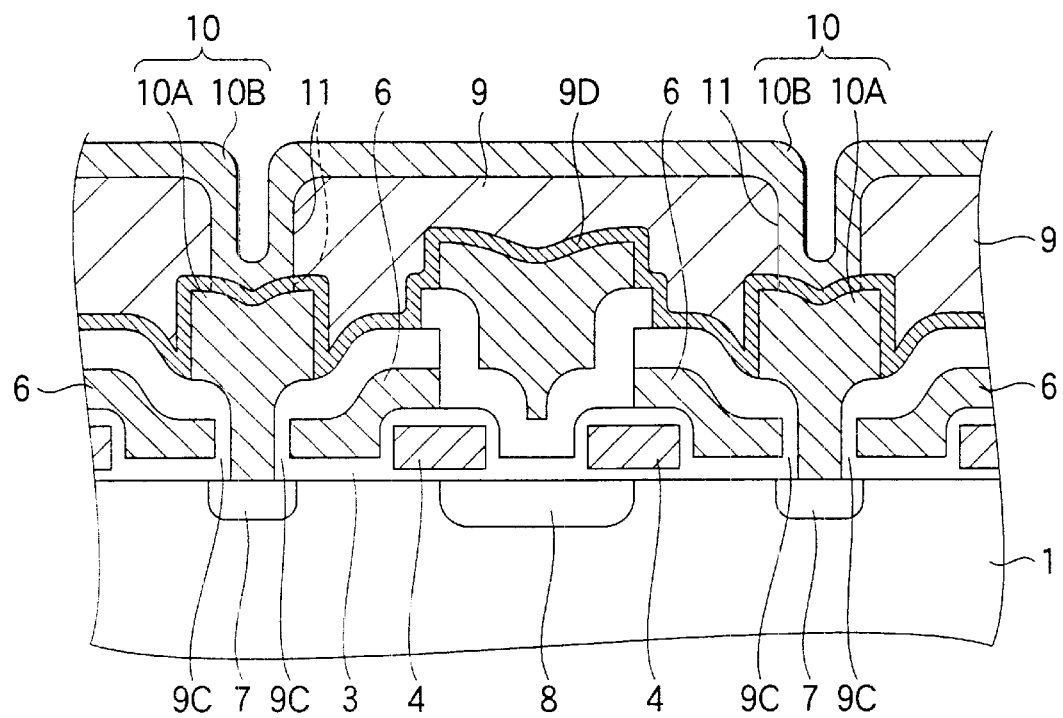

As shown in FIG. 4A, after a silicon nitride film 9D having a thickness of about 250 A–350 A (formed by LPCVD) and a BPSG film 9E having a thickness of 8000 A are successively formed on the entire surface of the substrate, an SOG film 9F for flattening having a thickness of about 2000 A is formed. The SOG film 9F and BPSG film 9E are etched back by a prescribed amount (to the position indicated by a one-dot chain line in FIG. 4A). Thereafter, the BPSG film 9E is heat-treated to form the dielectric films 9A, 9B, silicon nitride film 9D, side wall spacer film 9C and an interlayer dielectric film 9 composed of the BPSG film 9E and the SOG film 9F.

Incidentally, FIG. 4A exaggeratedly illustrates the state where the interlayer dielectric film 9 has been flattened. However, actually, the surface of the BPSG film 9E constituting the interlayer dielectric film 9 includes depressed areas. The SOG film 9F is left in the depressed areas so that it is scattered on the interlayer dielectric layer 9.

As shown in FIG. 4B, using the photoresist film (not shown) formed on the interlayer dielectric film 9, a contact hole 11 in contact with the electrode wiring film 10A on the drain region 7 is made. Thereafter, the contact hole 11 is filled with a metallic film 10B (e.g. Al film, Al—Si film, Al—Cu film, Al—Si—Cu film). Thus, a metallic wiring 10 composed of the electrode wiring film 10A and metallic film 10B is formed.

Incidentally, the metallic wiring 10 may be formed to include the electrode wiring film 10A, contact plug and metallic film 10B in such a manner that the contact plug of a tungsten film is embedded in the electrode wiring film 10A so that it is electrically connected to the electrode wiring film 10A and the metallic film (e.g. Al film, Al—Si film, Al—Cu film, Al—Si—Cu film, etc.) is formed on the contact plug. The metallic wiring may be composed of only the contact plug and metallic film without using the electrode wiring film 10A.

Finally, a plasma silicon nitride film serving as a passivation film is formed by the plasma CVD so that the non-volatile semiconductor memory device according to the first embodiment of the present invention is completed.

Embodiment 2

Now referring to the drawings, an explanation will be given of a non-volatile semiconductor memory device according to the second embodiment of the present invention.

Figure 7A:
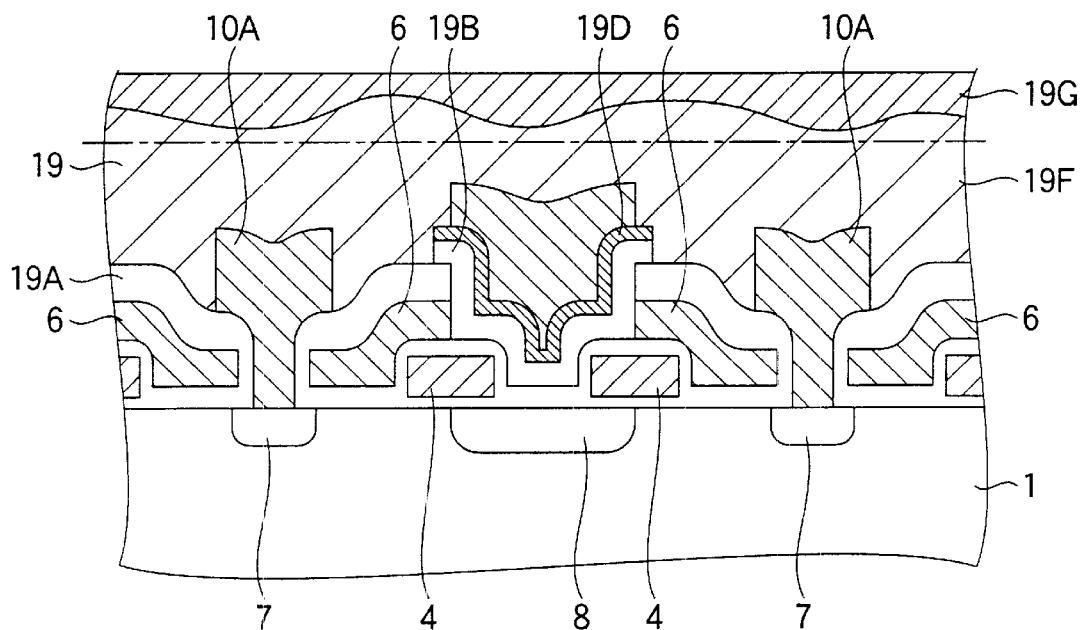
Figure 7B:
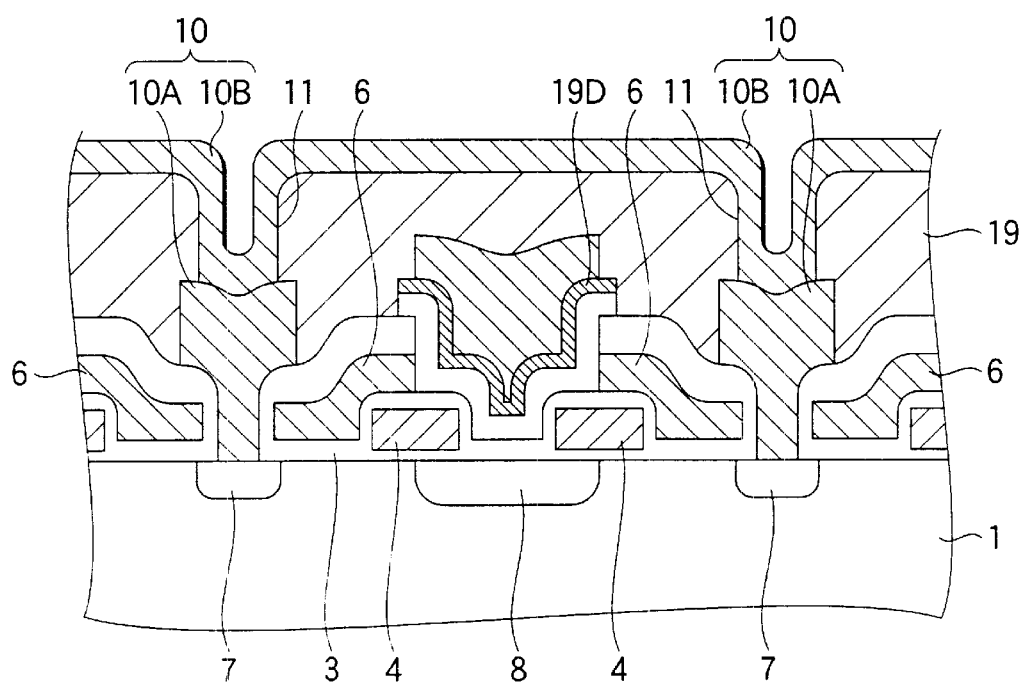

The feature of the second embodiment resides in that a silicon nitride film 19D serving as a barrier film is located only the region covering the memory cell as shown in FIG. 7B.

In this way, in order to suppress H, OH, etc., which deteriorate the memory cell characteristic, diffused from the SOG film from being trapped by the tunnelling oxide film 3, the silicon nitride film is mainly formed on the region covering the memory cell composed of the floating gate 4 and control gate 6 which are liable to be an invasion passage, thereby preventing the "trap-up rate" from being reduced.

In the first embodiment (FIGS. 4A and 4B), the silicon nitride film 9D was formed on the entire region lower than at least the SOG film 9F. As the case may be, such a configuration led to the following problem.

Specifically, as shown in FIG. 4B, film peeling-off occurred because of the poor contact between the silicon nitride film and tungsten silicide film of the electrode wiring film 10A.

In order to overcome such an inconvenience, in the second embodiment, as shown in FIG. 7B, the silicon nitride film 19D is located in only the region covering the memory cell so that the area where the silicon nitride film 19D is contact with the tungsten silicide film is reduced, thereby realizing a high-quality non-volatile semiconductor memory device capable of suppressing the film peeling-off.

The device according to this embodiment, in which the silicon nitride film 19D is not formed on the entire surface, can solve the problem of occurrence of dust due to the film peeling-off on the outermost periphery of a wafer.

In this embodiment, although the silicon nitride film 19D is located in only the region covering the memory cell, it may be formed to exclude only the region corresponding to a chip edge. Such a configuration also solve the problem of occurrence of dust due to the film peeling-off on the outermost periphery of the wafer.

Now referring to the drawings simplified for illustration, an explanation will be given of a method of manufacturing a memory cell of such a non-volatile semiconductor memory device. In order to avoid the repetition of explanation, only the manufacturing steps successive to the step shown in FIGS. 2B will be explained below. In the following explanation, it should be noted that the dielectric films 9A, 9B in the first embodiment correspond to dielectric film 19A, 19B in this embodiment.

Figure 5A:
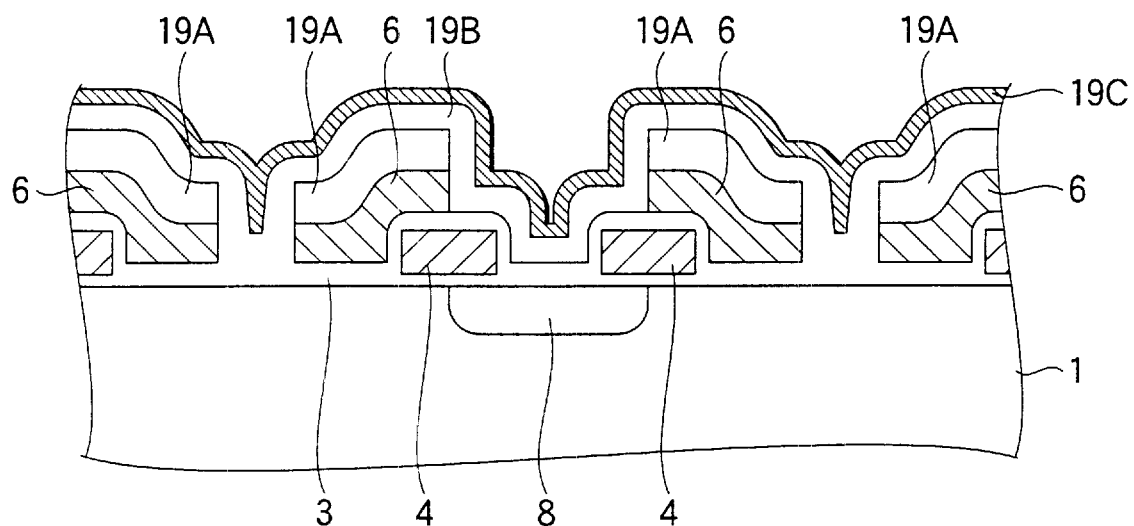

As shown in FIG. 2B in the first embodiment, by LPCVD, a dielectric film 19B made of an oxide film having a thickness of about 2000 A is formed on the entire surface of the substrate 1. Thereafter, as shown in FIG. 5A, by LPCVD, a silicon nitride film 19C having a thickness of about 250 A–350 A is formed on the entire surface of the substrate.

Figure 5B:
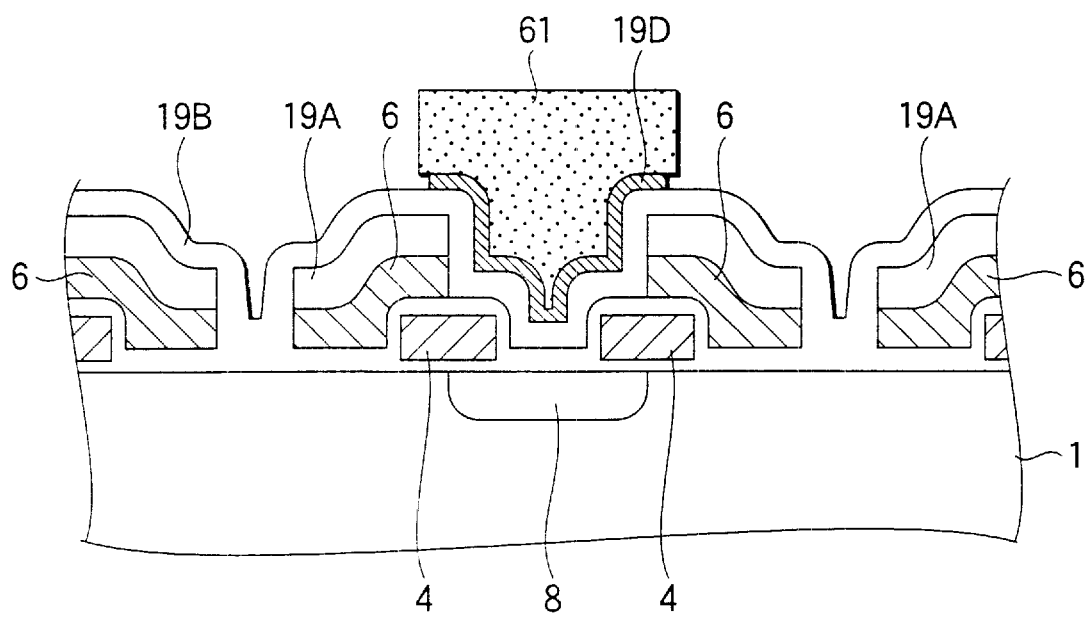

As shown in FIG. 5B, a photoresist film 61 is formed on the floating gates 4 and control gates 6 on the sides adjacent to the source region 8. Using the photoresist film 61 as a mask, the silicon nitride film 19C is patterned to form a silicon nitride film 19D.

The silicon nitride film 19D, is a feature of the present invention. The silicon nitride film 19D suppresses H, OH, etc., which are diffused from the interlayer dielectric film 19 inclusive of the SOG film (described later) like the first embodiment, from invading the memory cell (particularly, tunneling oxide film 3), thereby improving the trap-up rate. In addition, since the silicon nitride film 19D is formed in only the region covering the memory cell composed of the floating gate 4 and control gate 6 (i.e. mainly in the invasion passage of H, OH, etc. which deteriorate the characteristic of the memory cell), its contact area with the tungsten silicide film which is a cause of film peeling-off is reduced, thereby preventing the film peeling-off.

Figure 6A:
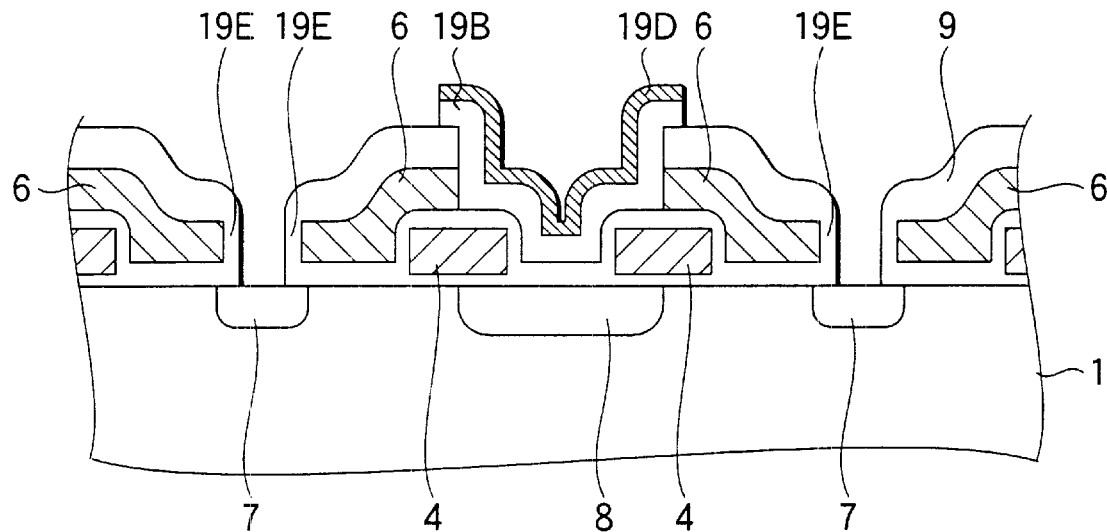
FIGS. 6 to 7 are sectional views for explaining the method of manufacturing a non-volatile semiconductor memory device according to another embodiment of the present invention.

As shown in FIG. 6A, after the photoresist film 61 has been removed, using the silicon nitride film 19D as a mask, the dielectric film 19B and tunneling film 3 are anisotropically etched to expose an area where a drain region is to be formed and to form a side wall spacer film 19E. The surface layer of the substrate 1 between the adjacent control gates 4 is doped or implanted with N-type impurities, e.g. phosphorus ions under the condition of dosage of $1.0 \times 10^{13}/cm^2$ and an acceleration voltage of 40 KeV, and diffused by annealing to form a drain region 7. The N-type impurities to be ion-implanted may be arsenic (As) ions.

Figure 6B:
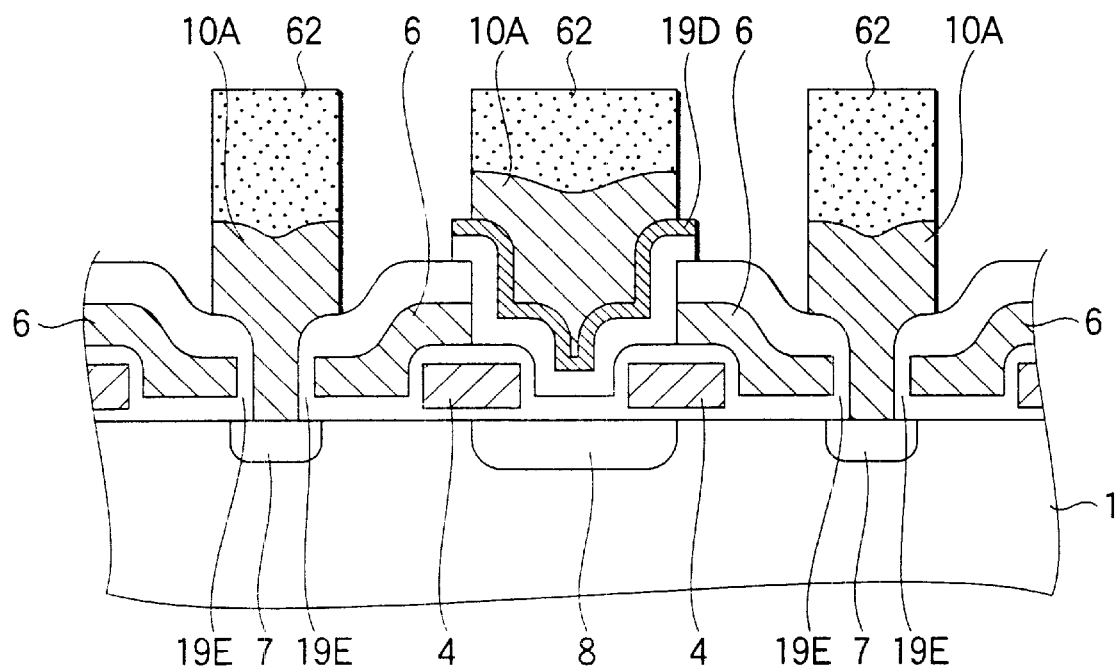

As shown in FIG. 6B, a laminate film, which is composed of a conductive polycrystalline silicon film having a thickness of 1000 A which is in contact with the source and drain regions and a tungsten silicide film (WSix film) having a thickness of 1200 A, is formed. Using a photoresist film 62 as a mask, the laminate film is patterned to form an electrode wiring film 10A. In this case, the electrode wiring film 10A in contact with the drain region 7 is formed in a self-aligned manner through the side wall spacer film 19E.

As shown in FIG. 7A, after a BPSG film 19F having a thickness of 8000 A is formed on the entire surface of the substrate, an SOG film 19G for flattening having a thickness of about 2000 A is formed. The SOG film 19G and BPSG film 19F are etched back by a prescribed amount (to the position indicated by a one-dot chain line in FIG. 7A). Thereafter, the BPSG film 19F is heat-treated to form the dielectric films 19A, 19B, silicon nitride film 19D, side wall spacer film 19E and an interlayer dielectric film 19 composed of the BPSG film 19F and the SOG film 19G. Incidentally, FIG. 7A exaggeratedly shows the state where the interlayer dielectric film 19 has been flattened. However, actually, the surface of the BPSG film 19F constituting the interlayer dielectric film 19 includes depressed areas. The SOG film 19G is left in the depressed areas so that it is scattered on the interlayer dielectric layer 19.

As shown in FIG. 7B, using the photoresist film (not shown) formed on the interlayer dielectric film 19, a contact hole 11 in contact with the electrode wiring film 10A on the drain region 7 is made. Thereafter, the contact hole 11 is filled with a metallic film 10B (e.g. Al film, Al—Si film, Al—Cu film, Al—Si—Cu film). Thus, a metallic wiring 10 composed of the electrode wiring film 10A and metallic film 10B is formed.

Incidentally, as in the first embodiment, the metallic wiring 10 may be formed to include the electrode wiring film 10A, contact plug and metallic film 10B in such a manner that the contact plug of a tungsten film is embedded in the electrode wiring film 10A so that it is electrically connected to the electrode wiring film 10A and the metallic film (e.g. Al film, Al—Si film, Al—Cu film, Al—Si—Cu film, etc.) is formed on the contact plug. The metallic wiring may be composed of only the contact plug and metallic film without using the electrode wiring film 10A.

Finally, a plasma silicon nitride film serving as a passivation film is formed by the plasma CVD so that the non-volatile semiconductor memory device according to the second embodiment of the present invention is completed.

Figure 11:
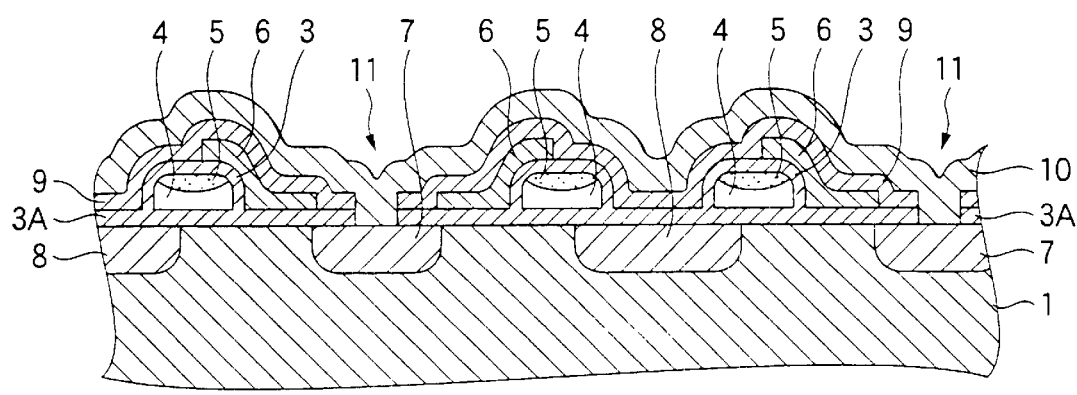
FIG. 11 is a partially sectional view of FIG. 10.

Now referring to FIGS. 8A to 8C, an explanation will be given of a method of making an acute corner on the upper side of the floating gate 4 as shown in FIG. 11.

Figure 8A:
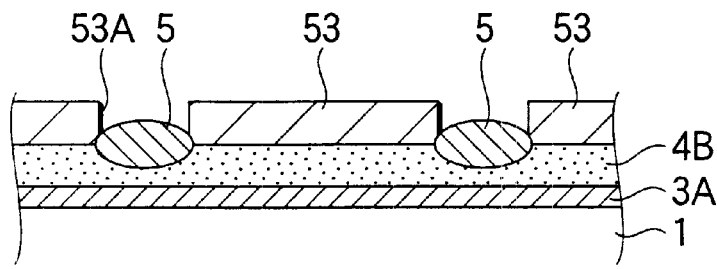
FIG. 8 is a sectional view for explaining a method of manufacturing a non-volatile semiconductor memory device according to the present invention.

First, as seen from FIG. 8A, the surface of a P-type semiconductor substrate 1 is thermally oxidized to form a gate oxide film 3A. A polycrystalline silicon film 4B which is doped with phosphorus and made conductive is formed on the gate oxide film 3. After a silicon nitride film 53 having openings 53A each having a predetermined pattern is formed on the polycrystalline silicon film 4B, the polycrystalline silicon film 4B is selectively oxidized through the openings 53A to form a selectively oxidized film 5.

Figure 8B:
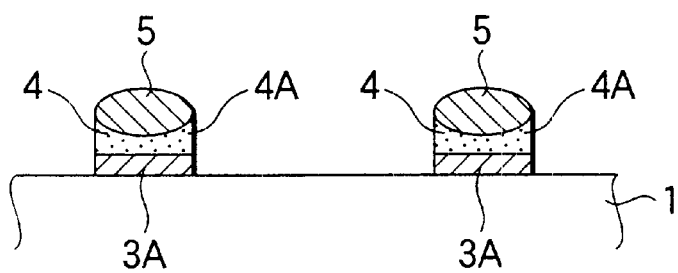

As seen from FIG. 8B, using the selectively oxidized film 5 as a mask, the polycrystalline silicon film 4B is anisotropically etched to form floating gates 4 each having an acute corner 4A on the upper side.

Figure 8C:
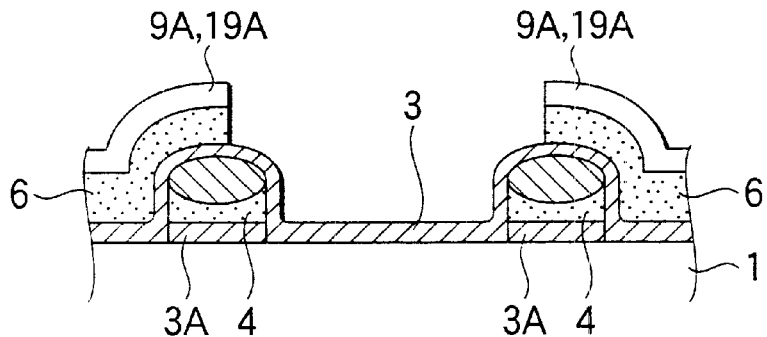
Figure 9:
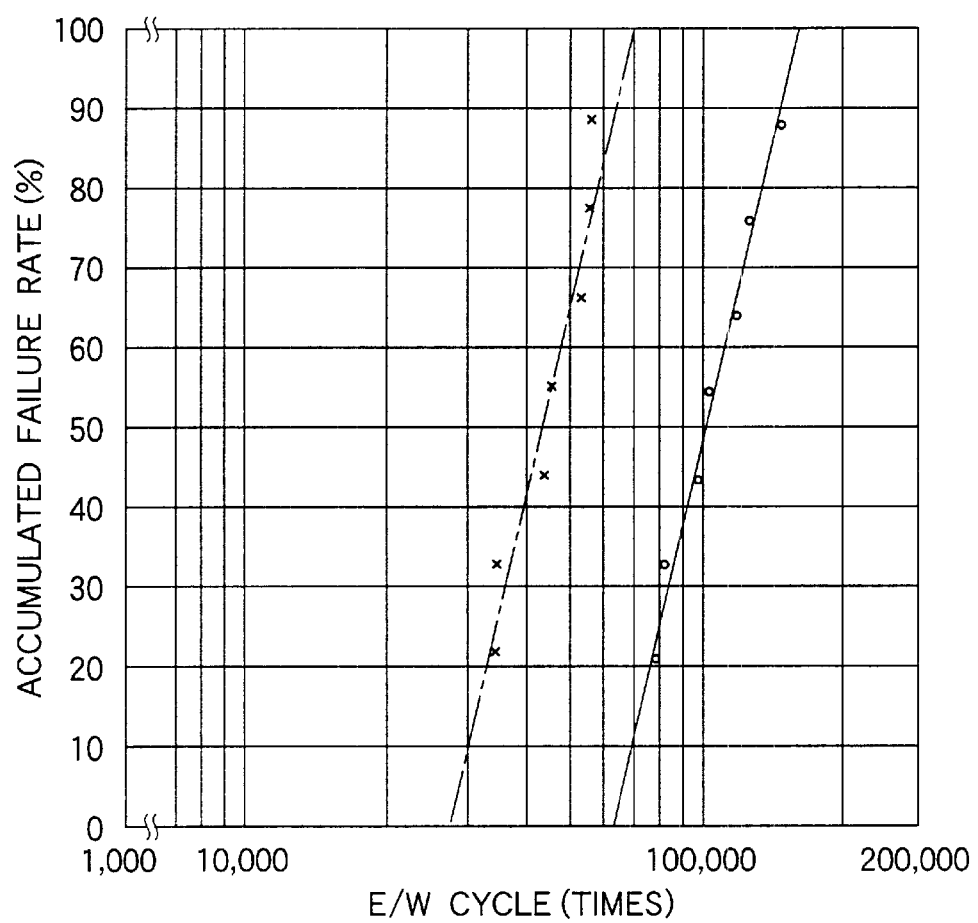
FIG. 9 is a graph showing the cycle life of a non-volatile semiconductor memory device.

As seen from FIG. 8C, a tunneling oxide film 3 is formed so as to cover the floating gates 4. Further, after a laminate film composed of a polycrystalline silicon film made conductive, tungsten silicide (WSix) film and a dielectric film 9A (19A) is formed on the tunneling oxide film 3, it is patterned to form control gates 6 each having a region overlapping the floating gate 5 through the tunneling oxide film 3. Because of provision of the acute corner 4A, concentration of an electric field is likely to occur at the edge of the floating gate 4 during data erasure, thereby improving the erasure characteristic. Hereafter, the subsequent steps described above are successively effected to complete the non-volatile semiconductor memory device according to the present invention.

Now, as apparent from the measurement result indicated by solid line of the cycle life (number of times of data erasure/write: E/W cycle) in the device according to the present invention, the accumulate failure rate is only 50% even when the E/W cycle reaches 100,000 times. It becomes 100% first when the E/W cycle reaches 160,000. This demonstrates improvement of the cycle life.

Incidentally, although the embodiments of the present invention have been applied to a split-gate flash memory, the present invention may be applied to a stacked gate-type flash memory.

What is claimed is:

1. A method for manufacturing a non-volatile semiconductor memory device comprising the steps of:
    forming a gate dielectric film on a semiconductor substrate having a first conduction type;
    forming a floating gate on the gate dielectric film;
    forming a tunneling dielectric film so as to cover said floating gate;
    forming a control gate on the tunneling dielectric film so as to have a region overlapping said floating gate through said tunneling dielectric film;
    forming a diffused region on a surface of said semiconductor substrate adjacent to said floating gate and said control gate, said diffused region having a second conduction type opposite to the first conduction type;
    forming a silicon nitride film on the entire surface of said semiconductor substrate;
    successively stacking an interlayer dielectric film and an SOG film on the silicon nitride film and etching-back said SOG film to form a flattened dielectric film; and
    forming wiring in contact with said diffused region through a hole made in said interlayer dielectric layer.

2. A method for manufacturing a non-volatile semiconductor memory device according to claim 1,
    wherein said step of forming a diffused region comprises the steps of:
        forming a silicon nitride film, on the entire surface of said semiconductor substrate inclusive of an electrode wiring film after having formed said wiring in contact with said diffused region.

3. A method for manufacturing a non-volatile semiconductor memory device according to claim 1,
    wherein said step of forming a diffused region comprises the steps of:
        forming a first diffused region on a surface of said semiconductor substrate so as to be located between the adjacent floating gates, said first diffused region having a second conduction type opposite to the first conduction type;
        after having formed a dielectric film on the entire surface of said semiconductor substrate, anisotropically etching said dielectric film using a photoresist film formed on the floating gate and control gate on the side adjacent to said first diffused region so that the surface of said semiconductor substrate on a region where a second diffused region is to be formed is exposed;
        forming said second diffused region having the second conduction type on the surface of said semiconductor substrate.

4. A method for manufacturing a non-volatile semiconductor memory device comprising the steps of:
    forming a gate dielectric film on a semiconductor substrate having a first conduction type;
    forming floating gates on the gate dielectric film;
    forming a tunneling dielectric film so as to cover said floating gate;
    forming control gates on the tunneling dielectric film so as to have a region overlapping said floating gates through said tunneling dielectric film;
    forming a first diffused region on a surface of said semiconductor substrate so as to be located between the adjacent floating gates, said diffused region having a second conduction type opposite to the first conduction type;
    after having formed a dielectric film and a silicon nitride film on the entire surface of said semiconductor substrate, anisotropically etching said dielectric film and said silicon nitride film using a photoresist film formed on the floating gate and control gate on the side adjacent to said first diffused region so that said silicon nitride film is patterned and the surface of said semiconductor substrate on a region where a second diffused region is to be formed is exposed;

forming said second diffused region having the second conduction type on the surface of said semiconductor substrate;

after having formed an electrode wiring film in contact with said first and second diffused regions, forming a silicon nitride film on the entire surface of said semiconductor substrate inclusive of said electrode wiring film;

successively stacking a dielectric film and an SOG film on the silicon nitride film and etching-back said SOG film to a form a flattened dielectric film; and forming a wiring in contact with said diffused region through a hole made in said interlayer dielectric layer.

5. A method for manufacturing a non-volatile semiconductor memory device according to claim 4, wherein said dielectric film is anisotropically etched by using said silicon nitride film as a mask after patterning said silicon nitride film.

6. A method for manufacturing a non-volatile semiconductor memory device according to claim 1, wherein the step of forming a floating gate and control gate comprises the steps of:

after having formed a first conductive film on said gate oxide film and an oxidation-resistant film having a prescribed pattern of opening, selectively oxidizing said first conductive film according to said opening to form a selectively oxidized film;

etching said first conductive film using said selectively oxidized film as a mask to form a floating gate having an acute corner on the upper side;

forming a tunneling dielectric film so as to cover said floating gate;

after having formed a second conductive film on said tunneling oxide film, patterning said conductive film to form a control gate so as to have a region overlapping said floating gate through said tunneling oxide film.

7. A method for manufacturing a non-volatile semiconductor memory device according to claim 4, wherein the step of forming a floating gate and control gate comprises the steps of:

after having formed a first conductive film on said gate oxide film and an oxidation-resistant film having a prescribed pattern of opening, selectively oxidizing said first conductive film according to said opening to form a selectively oxidized film;

etching said first conductive film using said selectively oxidized film as a mask to form a floating gate having an acute corner on the upper side;

forming a tunneling dielectric film so as to cover said floating gate;

after having formed a second conductive film on said tunneling oxide film, patterning said conductive film to form a control gate so as to have a region overlapping said floating gate through said tunneling oxide film;

forming a first diffused region on a surface of said semiconductor substrate so as to be located between the adjacent floating gates, said diffused region having a second conduction type opposite to the first conduction type;

after having formed a dielectric film and a silicon nitride film on the entire surface of said semiconductor substrate, patterning said silicon nitride film using a photoresist film formed on the floating gate and control gate on the side adjacent to said first diffused region.

8. The method of claim 1 wherein said tunneling dielectric film is formed by forming a oxide film by low pressure chemical vapor deposition, followed by thermal oxidation.

9. The method of claim 1 wherein said tunneling dielectric film is formed with a thickness of about 300 A.

10. The method of claim 1 wherein said silicon nitride film is formed with a thickness of about 250–350 A.

11. The method of claim 1 wherein said silicon nitride film forms a moisture barrier above said tunneling dielectric film.

12. A method for manufacturing a non-volatile semiconductor memory device comprising the steps of:

forming a gate dielectric film on a semiconductor substrate having a first conduction type;

forming a floating gate on the gate dielectric film;

forming a tunneling dielectric film so as to cover said floating gate;

forming a control gate on the tunneling dielectric film with a region of said control gate overlapping said floating gate through said tunneling dielectric film;

forming a diffused region on a surface of said semiconductor substrate adjacent to said floating gate and said control gate, said diffused region having a second conduction type opposite to the first conduction type;

forming a silicon nitride film on the entire surface of the device formed in the preceding steps; and forming a SOG film above said silicon nitride film, wherein said silicon nitride layer forms a moisture barrier between said tunneling dielectric film and said SOG film.

13. A method for manufacturing a non-volatile semiconductor memory device according to claim 4, further comprising:

anisotropically etching said silicon nitride film on the side adjacent to said first diffused region so that the surface of said semiconductor substrate in a region where a second diffused region is to be formed is exposed; and forming said second diffused region having the second conduction type in the surface of said semiconductor substrate.

* * * * *